United States Patent
Chen

(10) Patent No.: US 8,081,520 B2
(45) Date of Patent: Dec. 20, 2011

(54) OVER ERASE CORRECTION METHOD OF FLASH MEMORY APPARATUS

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 177 days.

(21) Appl. No.: 12/699,851

(22) Filed: Feb. 3, 2010

(65) Prior Publication Data

US 2011/0188308 A1    Aug. 4, 2011

(51) Int. Cl.
G11C 11/34    (2006.01)
G11C 16/04    (2006.01)

(52) U.S. Cl. ................... 365/185.3; 365/185.29
(58) Field of Classification Search ............. 365/185.29, 365/185.3, 185.22
See application file for complete search history.

(56) References Cited

U.S. PATENT DOCUMENTS

| | | | | |
|---|---|---|---|---|
| 5,844,847 A | * | 12/1998 | Kobatake | 365/185.29 |
| 6,046,932 A | * | 4/2000 | Bill et al. | 365/185.02 |
| 6,903,980 B2 | * | 6/2005 | Miki et al. | 365/185.3 |
| 7,599,228 B1 | * | 10/2009 | Lu et al. | 365/185.3 |

* cited by examiner

*Primary Examiner* — Anh Phung
(74) *Attorney, Agent, or Firm* — Jianq Chyun IP Office

(57) ABSTRACT

An over erase correction method of a flash memory apparatus is provided. The flash memory apparatus includes at least a microprocessor, a memory array, a bit line exchange unit and a column decoder. By controlling the column decoder of the flash memory during a period of the over-erase correction, the column decoder outputs control signals to the bit line exchange unit for selecting at least one of the bit lines according to a magnitude of the bit line leakage current. The drop in the charge pump voltage due to the bit line leakage current is reduced, and thus, the over-erase correction is executed effectively during the period of the over-erase correction.

7 Claims, 4 Drawing Sheets

OVER ERASE CORRECTION METHOD OF FLASH MEMORY APPARATUS

BACKGROUND OF THE INVENTION

1. Field of the Invention

The invention relates to an over erase correction method, and more particularly to an over erase correction method of a flash memory array for making the over erase correction effective and saving power.

2. Description of Related Art

Flash memory is an electrical erasable and programmable read only memory (EEPROM), which has the advantages of writable, erasable, and data retention after power interrupt. Therefore, the flash memory has been broadly applied in personal computer and electronic equipment. In addition, the flash memory is a kind of a non-volatile memory and has the properties of small volume, fast access speed and low power consumption. Further, the flash memory is characterized in erasing data with a block-by-block method.

While erasing the data of the flash memory, Fowler-Nordheim (FN) tunneling is typically applied to a cell of the flash memory, which pulls electrons from a floating gate of the cell through a tunneling oxide layer to a channel region in the cell. While performing erase operation by the FN tunneling, the number of electrons pulled from the floating gate is difficult to control. When an excessive amount of electrons is pulled from the floating gate, the polarity of the floating gate becomes positive to cause over-erase. As a result, not all of the cells have the same threshold voltage $V_{th}$.

FIG. 1 is a distribution of the threshold voltage related to the cell number. Referring to FIG. 1, all of the cells on the bit lines should have the distribution like this figure, but not all of the cells have the same threshold voltage $V_{th}$. To be more specific, during the erase operation by FN tunneling, the broad distribution of the threshold voltage often causes the bit line of the flash memory generating more leakage current, even if the gates of the cells are biased with zero voltage. The cells with the threshold voltage $V_{th} < V_{thL}$ contribute to the bit line leakage. Over erase is the situation when there is bit line leakage in the flash memory cells. This bit line leakage may induce read error to the cells in program state or programming failure.

Accordingly, an over erase correction is used to raise the threshold voltage of these cells, so that the bit line leakage is reduced. During a period of the over erase correction, all of the cells on the same bit line have the same gate voltage such as 0V, that is the corresponding word lines are at 0V. In the meanwhile, drains of the cells are biased with a charge pump voltage, which is couple to the corresponding bit lines, and thus, the hot electrons are injected into the floating gate again to increase the threshold voltage of the cells. The charge pump voltage coupled to the bit lines has to sustain the needed voltage to make the over erase correction effective.

In general, the time of the over erase correction performed on all of the bit lines with the corresponding word lines at 0V is much wasted. For example, if a bit line has 256 cells, the total time of the over erase correction is about several hundred micro-seconds to mini-seconds. In order to save the time of the over erase correction, if all of the gates of the cells are biased positively, it means all of the corresponding word lines are also biased positively, the bit lines will sink a huge leakage current. However, it is possible that there is a drop in the charge pump voltage due to the huge leakage current, so that the charge pump voltage is insufficient. For example, if the drop reduces the charge pump voltage to become lower than 3 voltages, the over erase correction is ineffective.

SUMMARY OF THE INVENTION

Accordingly, the exemplary embodiments consistent with the invention are directed to provide an over erase operation method of a flash memory apparatus for making the over erase correction effective and saving power.

According to one exemplary embodiment consistent with the invention, an over erase correction method of a flash memory apparatus is provided. The flash memory apparatus including at least a microprocessor, a memory array, a bit line exchange unit and a column decoder. The memory array includes a plurality of bit lines, a plurality of word lines and a plurality of memory cells, wherein each of the memory cells has a drain connected to the corresponding bit lines. The over erase correction method includes the following step. The flash memory apparatus which includes a memory array with a plurality of bit lines, a plurality of word lines and a plurality of memory cells is provided. Herein, each of the memory cells has a drain connected to the corresponding bit lines. All of the bit lines are selected during a period of an over-erase correction while a bit line leakage current is larger than a first predetermined current. A half of the bit lines are selected during the period of the over-erase correction while the bit line leakage current is smaller than the first predetermined current but larger than a second predetermined current. The over-erase correction is executed on the memory cells corresponding to the selected bit line during the period of the over-erase correction. It is noted that the order of the above steps does not limit the scope of the invention.

In the flash memory apparatus, a suitable over-erase correction method is applied. The over-erase correction method according to one exemplary embodiment of the invention is different from the conventional over-erase correction method. That is, by controlling the column decoder of the flash memory during the period of the over-erase correction, the column decoder outputs the control signal to the bit line exchange unit for selecting at least one of the bit lines according to the magnitude of the bit line leakage current. Therefore, the over-erase correction is executed effectively during the period of the over-erase correction, so that the power for the over-erase correction operation is reduced.

In order to make the features of the invention comprehensible, exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments consistent with the invention, and together with the description, serve to explain the principles of the invention.

DESCRIPTION OF EMBODIMENTS

The situation of the over erase correction being ineffective is undesirable. Therefore, a suitable flash memory apparatus and an over erase correction method thereof are needed, and the exemplary embodiments consistent with the invention are directed to provide a flash memory apparatus and an over erase operation method thereof for making the over erase correction effective and saving power.

Figure 1:
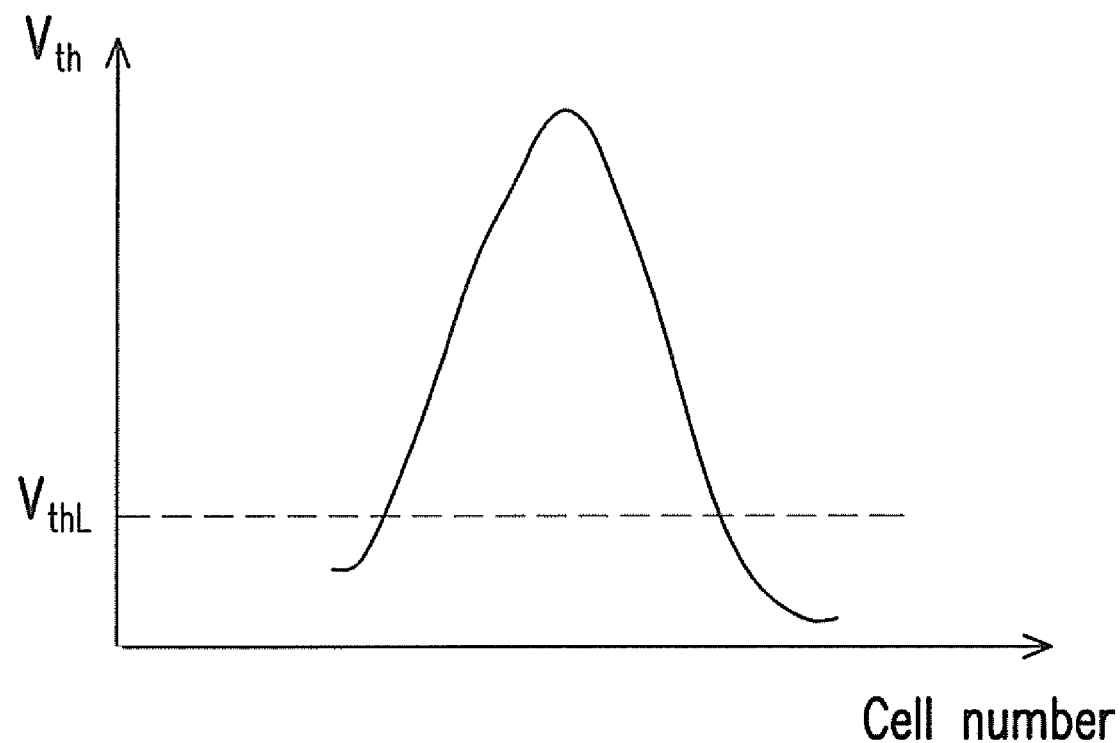
FIG. 1 is a distribution of the threshold voltage related to the cell number.
Figure 2:
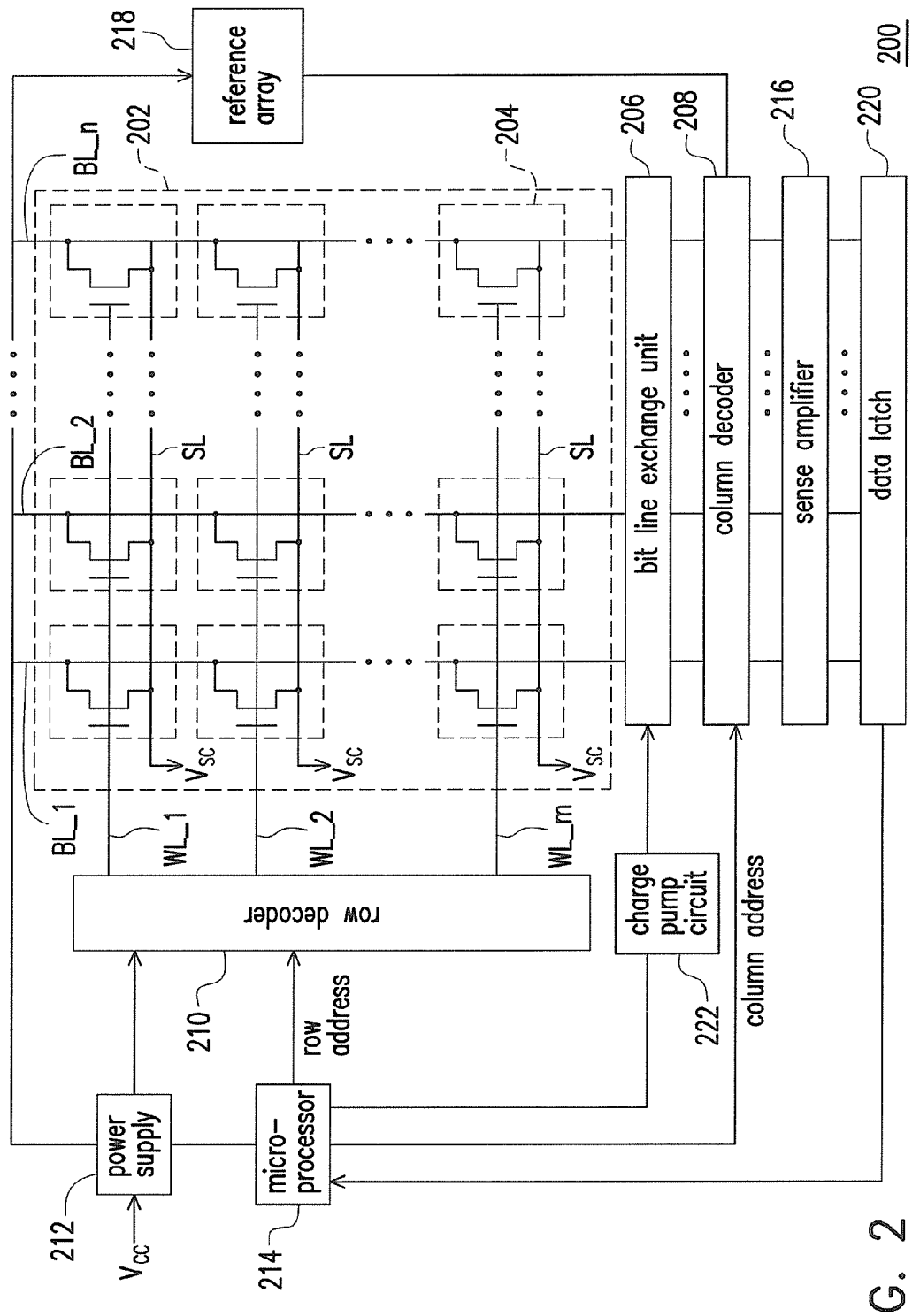
FIG. 2 is a block diagram of a flash memory apparatus according to one exemplary embodiment consistent with the invention.

FIG. 2 is a block diagram of a flash memory apparatus according to one exemplary embodiment consistent with the invention. Referring to FIG. 2, the flash memory apparatus 200 includes a flash electrically erasable programmable read-only memory array 202 (EEPROM) and a circuit (i.e. combination of the other elements 206-222) for the memory array 202 to perform writing, erasing, reading, and an over erase correction. Herein, the EEPROM array 202 is exemplary, but the invention is not limited thereto.

The memory array 202 includes a plurality of cells 204. Each of the cells 204 has a drain coupled to one of bit lines BL_1 through BL_n and a gate coupled to one of word lines WL_1 through WL_m. Besides, sources of the cells are all connected to a common voltage Vsc through a plurality of source lines SL. The plurality of bit lines BL_1 through BL_n extend in a longitudinal direction and are connected to a bit line exchange unit 206. The plurality of word lines WL_1 through WL_m extend in a lateral direction and are connected to a row decoder 210. The plurality of cells 204 are arranged in a matrix form and are provided in correspondence to inter-section points of the bit lines BL_1 through BL_n and the word lines WL_1 through WL_m.

A row decoder 210 receives a voltage signal from a power supply 212, and is controlled by a microprocessor 214, so that the row decoder 210 delivers specific voltage signals to the corresponding word lines in response to row addresses from the microprocessor 214. Similarly, A bit line exchange unit 206 receives a voltage signal from the power supply 212, and is also controlled by the microprocessor 214, so that the bit line exchange unit 206 delivers specific voltage signals to the corresponding bit lines.

A column decoder 208 is controlled by the microprocessor 214, so that the column decoder 208 transmits specific voltage signals from the corresponding bit lines to a sense amplifier 216 in response to column addresses from the microprocessor 214. The power supply 212 supplies specific voltage to the column decoder 208 and all of the bit lines BL_1 through BL_n. The sense amplifier 216 further receives a reference signal from a reference array 218. According to the signals from the column decoder 208 and the reference array 218, the sense amplifier 216 transmits signals to the microprocessor 214 through a data latch 220 for indicating a state between one of the bit lines BL_1 through BL_n and one of reference cells line (not shown).

People ordinarily skilled in the art realize the operation at the time of data writing (programming), reading and erasing to the cells 204 in flash memory apparatus 200, so that details related to the operation between the said components in flash memory apparatus are not described herein.

In order to prevent from over erasing, an over erase correction is applied to the over erased cells. The over erase correction corrects the over erased cells by enhancing the threshold voltage of the over erased cells up to a minimum. After that, the minimum threshold voltage of the corrected cells can prevent from reading error to the cells in program state due to a bit line leakage distributed from the over erased cells. If a power supply voltage Vcc is lower than 5 voltages, such as 3 voltages or lower one, the flash memory apparatus 200 need a charge pump circuit 222. The charge pump circuit 222 pumps the voltage of the related bit lines to higher than 3 voltages during a period of the over-erase correction. The charge pump circuit 222 has to sustain the bit line leakage.

Figure 3:
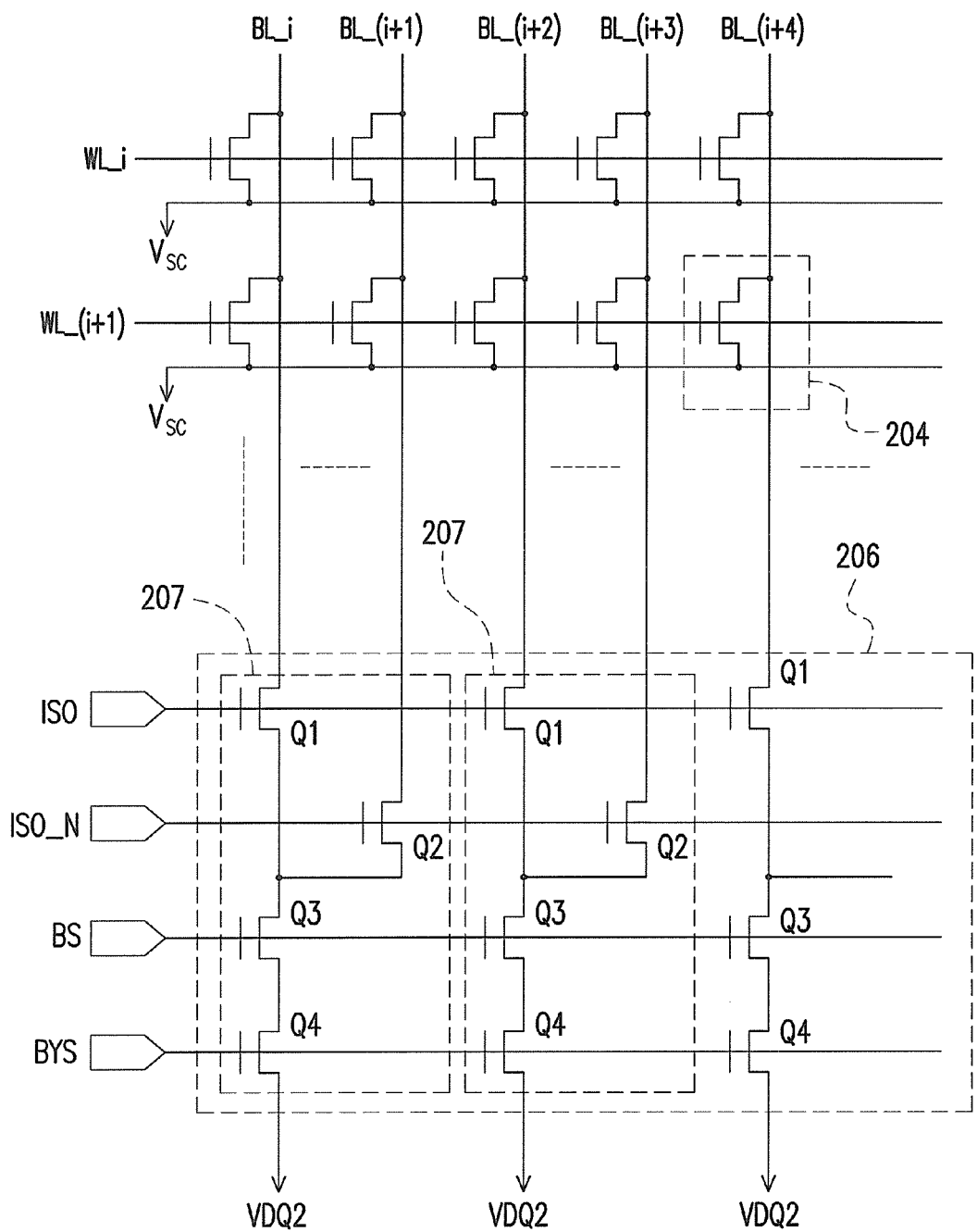
FIG. 3 is a circuit diagram of a flash memory apparatus related to parts of the bit lines and the word lines, and the bit line exchange unit according to one exemplary embodiment consistent with the invention.

FIG. 3 is a circuit diagram of a flash memory apparatus related to the bit lines to BL_1 through BL_n and the word lines WL_1 through WL_m, and the bit line exchange unit 206 according to one exemplary embodiment consistent with the invention. Referring to FIG. 3, the bit line exchange unit 206 includes a plurality of bit switch units 207. Each of the bit switch units 207 is respectively coupled to two of the bit lines BL_1 through BL_n and a charge pump voltage VDQ2 in the exemplary embodiment. For example, the bit switch unit 207 has a first transistor Q1 coupled to the odd$^{th}$ bit line BL_i, a second transistor Q2 coupled to the even$^{th}$ bit line BL_(i+1), and a fourth transistor Q4 coupled the charge pump voltage VDQ2, wherein i is an integer, and i≧1.

During different periods of the over-erase correction, each of the bit switch units 207 receives a plurality of control signals ISO, ISO_N, BS, and BYS from the column decoder 208 for selecting one of the bit lines in each of the bit switch units 207. That is, the microprocessor 214 controls the column decoder 208 to output the control signals ISO, ISO_N, BS, and BYS to the bit line exchange unit 206 for selecting a half of the bit lines, so that the over-erase correction is executed on the memory cells corresponding to the selected bit line during the period of the over-erase correction. It should be noted that the microprocessor 214 controls the column decoder 208 to output the control signals ISO, ISO_N, BS, and BYS to the bit line exchange unit according to a magnitude of the bit line leakage current contributed from the cells 204, so that the over-erase correction is executed on the memory cells 204 corresponding to the selected bit lines during the period of the over-erase correction. Besides, the magnitude of the bit line leakage current is obtained from the sense amplifier 216.

As known from above, the bit line exchange unit 206 selects the at least one bit line according to the magnitude of the bit line leakage current, so that the bit lines will not sink a huge leakage current. Accordingly, by controlling the bit line exchange unit 206 to select at least one of the bit lines, a drop in the charge pump voltage VDQ2 due to the bit line leakage current is reduced, and thus, the over-erase correction is executed effectively during the period of the over-erase correction.

Herein, the bit switch units 207 alternatively select the odd$^{th}$ bit lines and the neighboring even$^{th}$ bit lines during the successive periods of the over-erase correction, but the design is not used to limit the scope of the invention. In other embodiments, the bit switch units can have a plurality transistors coupled to the corresponding bit lines for selecting the different ones of the bit lines For example, the bit switch unit 207 further has a transistor coupled to the corresponding bit line, and thus, the bit line exchange unit 206 respectively selects the $(3k+1)^{th}$, the $(3k+2)^{th}$, and the $(3k+3)^{th}$ bit lines during the successive periods of the over-erase correction, wherein k is an integer, and k≧1. Furthermore, since the voltage threshold is drop below the minimum threshold with a certain probability, the over erase correction can be performed only on some bit lines. To sum up, the exemplary embodiment described above is not used to limit the scope of the invention.

Figure 4:
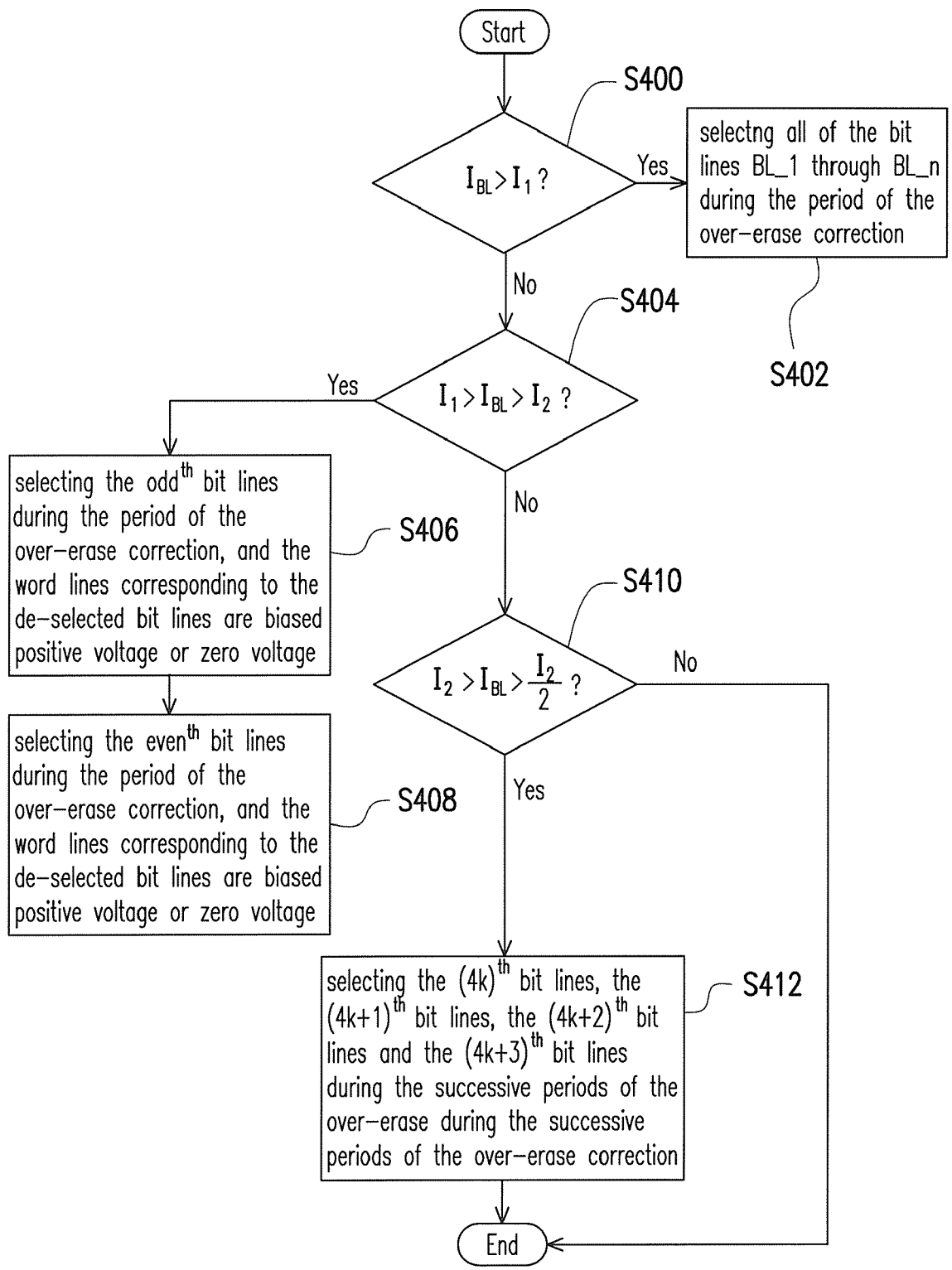
FIG. 4 is a flowchart of an over-erase correction method according to one exemplary embodiment consistent with the invention.

FIG. 4 is a flowchart of an over-erase correction method according to one exemplary embodiment consistent with the invention. The over erase correction is used to raise the threshold voltage of the cells 204, so that the bit line leakage contributed from the cells 204 is reduced. Reference to FIGS. 2-4, in step S400, while the bit line leakage current $I_{BL}$ is larger than a first predetermined current $I_1$, the bit line exchange unit 206 selects all of the bit lines BL_1 through BL_n during the period of the over-erase correction in step S402. That is, all of the cells 204 are corrected at once. Otherwise, the flow goes to step S404.

In step S404, while the bit line leakage current $I_{BL}$ is smaller than the first predetermined current $I_1$ but larger than a second predetermined current $I_2$, the bit line exchange unit 206 respectively selects a half of the bit lines during the successive periods of the over-erase correction in steps S406 and S408. Herein, the second predetermined current $I_2$, for example, is one-$n^{th}$ of the first predetermined current $I_1$, and the word lines corresponding to the de-selected bit lines are biased a suitable positive voltage or zero voltage.

To be more specific, if n=2, the second predetermined current $I_2$ is a half of the first predetermined current $I_1$, the bit line exchange unit 206, for example, selects the odd$^{th}$ bit lines during the period of the over-erase correction in step 406, and then selects the even$^{th}$ bit lines during a next period of the over-erase correction in step 408. In the meanwhile, the word lines corresponding to the de-selected bit lines are biased a suitable positive voltage or zero voltage. Accordingly, the charge pump voltage VDQ2 is successively delivered to the odd$^{th}$ bit lines and the even$^{th}$ bit lines in steps S406 and S408 for raising the threshold voltage of the cells 204.

It is noted that due to the voltage threshold is drop below the minimum threshold with a certain probability, only one of steps 406 and 408 is required, and the other one can be removed. Moreover, the amount of the selected bit lines and the manner for selecting the bit lines are not used to limit the scope of the invention.

On the contrary, while the bit line leakage current $I_{BL}$ is smaller than the second predetermined current $I_2$, the flow goes to step S410. In step S410, while the bit line leakage current $I_{BL}$, is smaller than the second predetermined current $I_2$ but larger than a half of the second predetermined current $I_2$, the bit line exchange unit 206 respectively selects an one-$(2n)^{th}$ of the bit lines BL_1 through BL_n during successive periods of the over-erase correction in step S412. For example, if n=2, it means that the bit line exchange unit 206 selects one-fourth of the bit lines BL_1 through BL_n at once for the over-erase correction. The bit line exchange unit 206 sequentially selects the $(4k+1)^{th}$ bit lines, the $(4k+2)^{th}$ bit lines, the $(4k+3)^{th}$ bit lines and the $(4k+4)^{th}$ bit lines during the successive periods of the over-erase correction in step 412. Accordingly, each quarter of the cells 204 are corrected at once in the over-erase correction. Finally, the over-erase correction method terminates. The drop in the charge pump voltage VDQ2 due to the bit line leakage current $I_{BL}$ is reduced, and thus, the over-erase correction is executed effectively during the period of the over-erase correction.

It is noted that due to the voltage threshold is drop below the minimum threshold with a certain probability, the over erase correction can be performed only on some bit lines. Moreover, the amount of the selected bit lines and the manner for selecting the bit lines are not used to limit the scope of the invention.

In the exemplary embodiment, the steps S406 and S408 can be exchanged according to the design. That is, the bit line exchange unit 206 selects the even$^{th}$ bit lines during the period of the over-erase correction first, and then selects the odd$^{th}$ bit lines during the next period of the over-erase correction. In another exemplary embodiment, the second predetermined current $I_2$ may be one-third of the first predetermined current $I_1$, i.e. n=3. Accordingly, while the bit line leakage current $I_{BL}$ is between one-third of the first predetermined current $I_1$ and one-sixth of the first predetermined current $I_1$, the bit line exchange unit 206 respectively selects the $(6k+1)^{th}$, the $(6k+2)^{th}$, . . . , and the $(6k+6)^{th}$ bit lines during the successive periods of the over-erase correction in step S412.

To sum up, by controlling the column decoder of the flash memory during the period of the over-erase correction, the column decoder outputs the control signal to the bit line exchange unit for selecting at least one of the bit lines according to the magnitude of the bit line leakage current. The drop in the charge pump voltage due to the bit line leakage current is reduced, and thus, the over-erase correction is executed effectively during the period of the over-erase correction.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An over erase correction method of a flash memory apparatus, comprising:
   providing the flash memory apparatus, comprising a memory array with a plurality of bit lines, a plurality of word lines and a plurality of memory cells, wherein each of the memory cells has a drain connected to the corresponding bit lines;
   selecting all of the bit lines during a period of an over-erase correction while a bit line leakage current is larger than a first predetermined current;
   selecting a half of the bit lines during the period of the over-erase correction while the bit line leakage current is smaller than the first predetermined current but larger than a second predetermined current; and
   executing the over-erase correction on the memory cells corresponding to the selected bit line during the period of the over-erase correction.

2. The over erase correction method as claimed in claim 1, wherein in the step of selecting the half of the bit lines, selecting the odd bit lines or the even bit lines during the period of the over-erase correction.

3. The over erase correction method as claimed in claim 2, wherein during successive periods of the over-erase correction, the odd bit lines and the even bit lines are alternatively selected.

4. The over erase correction method as claimed in claim 1, further comprising:
   selecting one-$(2n)^{th}$ of the bit lines during the period of the over-erase correction while the bit line leakage current is smaller than the second predetermined current, but larger than a half of the second predetermined current, wherein n is an integer, and n≧2.

5. The over erase correction method as claimed in claim 4, wherein in the step of selecting the one-$(2n)^{th}$ of the bit lines, selecting the $(2nk+1)^{th}$, . . . , or the $[2nk+2n]^{th}$ bit lines during the period of the over-erase correction, wherein k is an integer, and k≧0.

6. The over erase correction method as claimed in claim 5, wherein during successive periods of the over-erase correction, the $(2nk+1)^{th}$, . . . , or the $[2nk+2n]^{th}$ bit lines are sequentially and respectively selected.

7. The over erase correction method as claimed in claim 4, wherein the second predetermined current is one-$n^{th}$ of the first predetermined current.

* * * * *